(12) United States Patent
Khan

(10) Patent No.: US 8,686,396 B2
(45) Date of Patent: *Apr. 1, 2014

(54) NON-POLAR ULTRAVIOLET LIGHT EMITTING DEVICE AND METHOD FOR FABRICATING SAME

(75) Inventor: Asif Khan, Irmo, SC (US)

(73) Assignee: Nitek, Inc., Columbia, SC (US)

( * ) Notice: Subject to any disclaimer, the term of this patent is extended or adjusted under 35 U.S.C. 154(b) by 1161 days.

This patent is subject to a terminal disclaimer.

(21) Appl. No.: 12/599,349

(22) PCT Filed: May 8, 2008

(86) PCT No.: PCT/US2008/063040
§ 371 (c)(1),
(2), (4) Date: Nov. 9, 2009

(87) PCT Pub. No.: WO2009/005894
PCT Pub. Date: Jan. 8, 2009

(65) Prior Publication Data
US 2010/0213436 A1  Aug. 26, 2010

Related U.S. Application Data

(60) Provisional application No. 60/924,289, filed on May 8, 2007.

(51) Int. Cl.
*H01L 29/06* (2006.01)
*H01L 31/00* (2006.01)

(52) U.S. Cl.
USPC .......... 257/13; 257/76; 257/78; 257/94; 257/E21.093

(58) Field of Classification Search
USPC .......... 257/615, 13, 15, E29.089, E33.008, 257/E33.027
See application file for complete search history.

(56) References Cited

U.S. PATENT DOCUMENTS

| 6,599,362 B2 | 7/2003 | Ashby et al. |
| 8,354,663 B2 * | 1/2013 | Adivarahan et al. ............ 257/13 |
| 2006/0175600 A1 | 8/2006 | Sato et al. |

(Continued)

FOREIGN PATENT DOCUMENTS

WO    2005/036658    4/2005

OTHER PUBLICATIONS

Cho, International Search Report and Written Opinion of ISA, PCT/US08/63040, Jul. 6, 2009.

*Primary Examiner* — Jarrett Stark
(74) *Attorney, Agent, or Firm* — Michael A. Mann; Nexsen Pruet, LLC

(57) ABSTRACT

An ultra-violet light-emitting device and method for fabricating an ultraviolet light emitting device, 12, (LED or an LD) with an AlInGaN multiple-quantum-well active region, 10, exhibiting stable cw-powers. The device includes a non c-plane template with an ultraviolet light-emitting structure thereon. The template includes a first buffer layer, 321, on a substrate, 100, then a second buffer layer, 421, on the first preferably with a strain-relieving layer, 302, in both buffer layers. Next there is a semiconductor layer having a first type of conductivity, 500, followed by a layer providing a quantum-well region, 600. Another semiconductor layer, 700, having a second type of conductivity is applied next. Two metal contacts, 980 and 990, are applied to this construction, one to the semiconductor layer having the first type of conductivity and the other to the semiconductor layer having the second type of conductivity, to complete the light emitting device.

53 Claims, 5 Drawing Sheets

(56) References Cited

U.S. PATENT DOCUMENTS

| | | |
|---|---|---|
| 2007/0034144 A1 | 2/2007 | Ogawa et al. |
| 2007/0126009 A1* | 6/2007 | Sakai et al. .............. 257/79 |
| 2010/0032647 A1* | 2/2010 | Khan et al. .............. 257/13 |
| 2010/0140745 A1* | 6/2010 | Khan et al. .............. 257/615 |
| 2010/0213436 A1* | 8/2010 | Khan .............. 257/13 |
| 2010/0264401 A1* | 10/2010 | Adivarahan et al. .............. 257/13 |
| 2010/0314605 A1* | 12/2010 | Khan .............. 257/13 |
| 2010/0320440 A1* | 12/2010 | Khan .............. 257/13 |

* cited by examiner

NON-POLAR ULTRAVIOLET LIGHT EMITTING DEVICE AND METHOD FOR FABRICATING SAME

CROSS-REFERENCE TO RELATED APPLICATIONS

The present application claims priority to U.S. Provisional Patent Application No. 60/924,289 filed May 8, 2007 which is incorporated herein by reference.

BACKGROUND OF THE INVENTION

The present invention relates generally to a non-polar ultra-violet light-emitting device and method of manufacturing a light-emitting device.

Group III nitride compound semiconductors such as, for instance, gallium nitride (GaN), aluminum nitride (AlN), indium nitride (InN) (hereinafter also referred to as a "Group III-nitride semiconductor" or "III-nitrides") have been gaining attention as a material for semiconductor devices that emit green, blue or ultraviolet light. A light-emitting device, which together with the acronym LED when used herein, will for convenience also refer to both a light-emitting diode and laser diode (LD) unless otherwise specified. Of particular interest herein are LED's which emit in the ultraviolet portion of the electromagnetic spectrum. An LED that emits ultraviolet radiation is expected to find applications in the field of ultra-violet curing, phototherapy, water and air purification, bio-detection, and germicidal treatment. The ultraviolet portion of the electromagnetic spectrum is typically radiation with a wavelength of 200-400 nm and radiation of less than about 300 is often referred to in the art as deep-UV. For the purposes of discussion the ultraviolet portion of the electromagnetic spectrum is often further subdivided by wavelength into UVA (315-380 nm), UVB (280-315 nm) and UVC (<280 nm). For the purposes of the present invention deep-UV (or DUV) refers to wavelengths of 200-300 nm and ultraviolet (or UV) refers to wavelengths of 200-400 nm.

UV emitting LED's are difficult to manufacture for a number of reasons. For example, defects arise from lattice and thermal mismatch between the group III-Nitride based semiconductor layers and the substrate. In addition, impurities and tilt boundaries result in the formation of crystalline defects. These defects have been shown to reduce the efficiency and lifetime of LEDs and LDs fabricated from these materials.

One way to reduce the dislocation density is based on the use of epitaxial lateral overgrowth (ELOG), which is a well-known technique in the prior art. With this method, the dislocation density can be reduced to about $10^5$ cm$^{-2}$ to $10^6$ cm$^{-2}$. This method, however, has been shown to be ineffective for the growth of aluminum-containing III-Nitride based semiconductors because of the tendency for the aluminum to stick to the masked material and disrupt the lateral overgrowth. Several variations of this approach have also been demonstrated including PENDEO epitaxy, and FACELO growth. All of these techniques suffer from the same limitation as the ELOG approach for aluminum containing III-Nitride materials.

Additionally, a technique called cantilever epitaxy involves growth from pillars that are defined through etching as opposed to, for example, masking.

Several other approaches to dislocation reduction have been reported that do not involve selective area growth including inserting an interlayer between the substrate and the semiconductor layer to relieve strain, filtering dislocations by bending them into each other by controlling surface facet formation or by inserting a Group III-Nitride super-lattice layer as described in Applied Physics Letters, Jul. 22, 2002; Volume 81, Issue 4, pp. 604-606, between the buffer layer and the active layer.

Accordingly, several research groups at present are developing III-nitride deep ultraviolet light emitting diodes for applications in air and water purification and bio-medical systems. Milli-watt power DUV LEDs on sapphire substrates with AlGaN multiple quantum well (MQW) active regions have been previously reported for the UVA, UVB and the UVC regions. The LED design used in the prior art benefited from several key innovations, namely: (1) the use of pulsed atomic layer epitaxy (PALE) to improve the quality of the buffer AlN layer; (2) the use of a PALE deposited AlN/Al$_x$Ga$_{1-x}$N, short-period super-lattice layer insertion between the buffer AlN and the n-contact AlGaN layer for controlling the thin-film stress and mitigating epilayer cracking; and (3) a p-GaN/p-AlGaN hetero-junction contact layer for improved hole injection.

In preparing semiconductor LED's of Al$_x$In$_y$Ga$_{1-x-y}$N wherein 0≤x≤1, 0≤y≤1 and 0≤x+y≤1, an AlN or GaN buffer layer is typically grown on a c-plane (0001) of a substrate and is therefore referred to as a c-plane buffer. The structure of the c-plane comprises a high density of threading dislocations which significantly reduces the lifetime of the light emitters and the manufacturing yield. In addition, the III-nitride LED's and LD's grown on the c-plane typically exhibit polarization related electric fields resulting in a quantum confined Stark effect. These electrostatic fields separate the electron and hole envelope wave functions in a heterostructure such as a quantum well. The consequent reduction in the envelope wave-function overlap results in a lower radiative efficiency for light-emitting devices. For LED's emitting in the visible portion of the electromagnetic spectrum the problems have been mitigated by growing on a non-polar GaN substrate using standard deposition techniques such as MOCVD or MBE. While helpful, this problem has not proven satisfactory for UV LED's which require high aluminum containing AlInGaN quantum wells when conventional deposition techniques are used. Under standard deposition conditions the epilayer quality suffers due to high gas phase reaction of the precursor sources. In addition, high aluminum containing AlInGaN device structure cracks due to tensile stress when grown directly on GaN substrates.

There still remains a need for higher quality, more reliable, more robust, deep UV light-emitting diodes and laser diodes and a method for preparing them.

SUMMARY OF THE INVENTION

It is an object of the present invention to provide an improved ultraviolet emitting LED.

A more particular object of the present invention is a non-polar ultraviolet emitting LED.

The present invention is an ultra-violet light-emitting device and method for fabricating an ultraviolet light emitting device. In a preferred embodiment, the present invention is an ultra-violet or deep ultra-violet light-emitting structure ($\lambda_{peak}$=200-400 nm) with an Al$_x$In$_y$Ga$_{1-x-y}$N, wherein 0≤x≤1, 0≤y≤0.2 and 0<x+y≤1, quantum-well active region on a template. The template includes a non c-plane substrate. Particularly preferred are non c-plane substrates selected from the group consisting of aluminum nitride, gallium nitride, aluminum gallium nitride, aluminum indium gallium nitride, aluminum indium nitride, SiC, sapphire and lithium aluminate. Even more preferred are an m-plane, a-plane or r-plane of a aluminum nitride, gallium nitride, aluminum gallium nitride, aluminum indium gallium nitride, aluminum indium nitride, SiC, sapphire or lithium aluminate substrate with at least one III-Nitride buffer layer thereon. In a particularly preferred embodiment at least one buffer layer is trenched and a second buffer layer forms a coalesced planar layer over the first buffer layer. The coalescing involves performing pulsed lateral overgrowth (PLOG) over deep trenches (height ≥0.1 μm), or over shallow or deep trenches if the pillars encompass more than one group III species or a combination of multiple layers. The pillars may consist of a multi-layer stack of III-Nitride based semiconductors including AlN, and a strain-relieving superlattice. In some embodiments additional layers are included in the pillars on top of the superlattice including $Al_xIn_yGa_{1-x-y}N$ (wherein 0≤x≤1, 0≤y≤0.2, and 0<x+y≤1), and additional superlattices with different average composition than the first superlattice. The second buffer layer, of AlN or $Al_xIn_yGa_{1-x-y}N$, wherein 0≤x≤1, 0≤y≤0.2 and 0≤x+y≤1, is grown by PLOG techniques over the etched pillars until it coalesces to form a planar surface. The ultraviolet light-emitting structure deposited on top of the planar surface on the template consists of pulsed atomic layer epitaxy (PALE) or conventional MOCVD deposited AlN, and in some embodiments an additional strain relief superlattice is deposited on the AlN. A thick (thickness ≥1.0 μm) undoped or n-type $Al_xIn_yGa_{1-x-y}N$, wherein 0≤x≤1, 0≤y≤0.2, and 0≤x+y≤1, layer is deposited next. If the $Al_xIn_yGa_{1-x-y}N$, wherein 0≤x≤1, 0≤y≤0.2 and 0≤x+y≤1, is undoped, an additional n-type $Al_xIn_yGa_{1-x-y}N$, wherein 0≤x≤1, 0≤y≤0.2) layer is deposited. This is followed by the quantum well active region and p-type $Al_xIn_yGa_{1-x-y}N$, wherein 0≤x≤1, 0≤y≤0.2 and 0≤x+y≤1, materials that form the top electrode for the light emitting device. Without wishing to be bound by theory, the superior performance of the present light-emitting diodes is attributed to the combination of reduced thermal impedance from the thick PLOG growth AlN or $Al_xIn_yGa_{1-x-y}N$, wherein 0≤x≤1, 0≤y≤0.2 and 0<x+y≤1, material, and a lower overall defect density in the laterally overgrown AlN or $Al_xIn_yGa_{1-x-y}N$, wherein 0≤x≤1, 0≤y≤0.2 and 0<x+y≤1, buffer.

The present diode demonstrates a reduced defect density when a group III-Nitride epitaxial layer is used in conjunction with a patterned template, where the template consists of a patterned non c-plane substrate with a single or multi-layer first buffer of III-Nitride semiconductor layers that are optionally etched into pillars. The low defect density III-Nitride second buffer layer is formed thereover by using a pulsed lateral overgrown III-Nitride layer.

The present method includes the steps of depositing a single or multiple layer buffer on the non c-plane substrate, trenching the buffer layer, applying an AlInGaN second buffer layer to the trenched buffer using pulsed lateral overgrowth techniques to form the template. Next, a deep ultraviolet light emitting structure (200 nm to 400 nm) is applied onto the template.

A feature of the present invention is that the buffer layer of the present invention can be either a single III-Nitride layer that is not thin (thickness >0.1 μm) for AlN, or consist of ternary (AlGaN, AlInN), quaternary (AlInGaN) or multiple layers of III-Nitride, preferably made of AlInGaN containing less than 0.2 mole fraction indium and containing a design optimized for both strain relief and optical transparency. In the prior art, the buffer layer consists of thin AlN in a single layer. Another feature is the use of the superlattice for both reducing defects and relieving strain. A superlattice is a series of thin layers of alternating composition that serves as a transducer from a lower layer to an upper layer, relieving stress and shifting the intralattice geometry from the first to the second layer.

Another feature of the present invention is the formation of deep trenches (depth ≥0.1 μm) before performing the PLOG growth. This shallow etch depth limited the amount of lateral overgrowth that could be successfully performed because growth also takes place in the trenches. In the present invention, the pillars can consist of either a non-c plane oriented single AlInGaN layer, or non-c plane oriented multiple stacks of AlInGaN layers with the etch depth greater than or equal to 0.1 μm, including any etching that occurs into the substrate.

As noted above the prior art teaches a technique referred to as cantilevered epitaxy but this technique differs from the current invention in that it does not involve pulsing of the growth species, which provides significant benefit for enhancing lateral growth, does not involve integration of strain relief structures within the etched pillars, and does not describe the methods of formation to achieve electrically injected light emitting structures on the reduced defect material.

Yet another feature of the present invention is the growth of a thick, doped or undoped, AlInGaN layer on top of the PLOG buffer, but below the light emitting diode AlInGaN:Si n-contact layer, such that the thickness of the AlInGaN layer is greater than or equal to 1 μm.

Other features and their advantages will be apparent to those skilled in the art of semi-conductor design and light-emitting diodes in particular from a careful reading of the foregoing Detailed Description of Preferred Embodiments, accompanied by the following drawings.

DETAILED DESCRIPTION OF PREFERRED EMBODIMENTS

Figure 4:
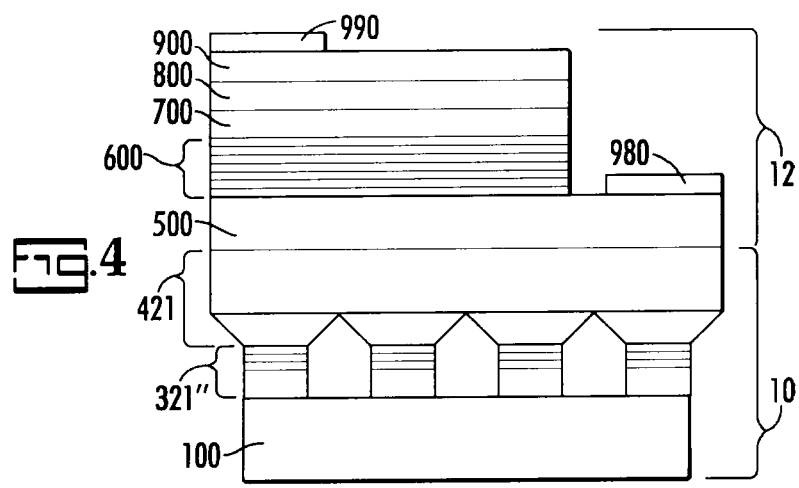
FIG. 4 is a schematic diagram of the epilayer structure of a light-emitting diode, according to a preferred embodiment of the present invention.

The present invention is an ultraviolet light-emitting device (LED) and a method for making an LED, particularly one that emits ultraviolet, and more preferably deep ultraviolet light. In particular, it is a template 10 that serves as a platform for an ultraviolet light-emitting structure 12 as shown in FIG. 4. Briefly, template 10 includes a non c-plane substrate. More preferably the substrate includes an m-plane {1-100} buffer layer, an a-plane {11-20} buffer layer, a {1014} semi polar buffer layer, a {1122} semi polar buffer layer, a {1011} semi polar buffer layer, a {1013} semi polar buffer layer, a {1012} semi polar buffer layer, and a {2021} semi polar buffer layer of a substrate with the m-plane and a-plane being more preferable and the m-plane being most preferable. The substrate is preferably selected from the group consisting of aluminum nitride, gallium nitride, aluminum gallium nitride, aluminum indium gallium nitride, aluminum indium nitride, SiC, sapphire and lithium aluminate. Throughout the present application a layer grown on a particular substrate will be named accordingly. By way of example a buffer layer formed on an m-plane will be referred to as an m-buffer, etc. A first buffer layer added onto the substrate is the first step in forming the LED wafer. The first buffer layer is then optionally, but preferably, etched to form a pattern of trenches. The trench depths are preferably greater than or equal to 0.1 µm to no more than 30 µm. The trench may be in the first buffer layer only or it may include the substrate. After patterning of the wafer, a second buffer is preferably applied to the first buffer wherein the second buffer is deposited to coalesce above the underlying pattern. Next, the ultraviolet light-emitting structure 12 is applied to template 10. First, a semiconductor layer having a first type of conductivity is applied, followed by several layers forming a quantum-well region with an emission spectrum ranging from 200 nm to 400 nm and more preferably 190 nm to 369 nm. Another semiconductor layer, or possibly more than one, having a second type of conductivity is applied next. Two metal contacts are applied to this construction, one to the semiconductor layer having the first type of conductivity and the other to the semiconductor layer having the second type of conductivity, to complete the LED. Each of these layers will be described in detail below.

Several of the layers and buffer layers are applied using a pulsed atomic layer epitaxy (PALE) growth technique, and the layer grown on the patterned wafer is grown using pulsed lateral overgrowth techniques. Each layer is made of a Group III-nitride, preferably $Al_xIn_yGa_{1-x-y}N$, wherein $0 \le x \le 1$, $0 \le y \le 0.2$ and $0 \le x+y \le 1$. In employing pulsed lateral overgrowth techniques, the precursor sources include a metal-organic source, preferably trimethyl aluminum, trimethyl gallium, triethyl gallium, trimethyl indium, ammonia, a carrier gas (such as hydrogen and/or nitrogen) and, optionally, doping sources such as silane, and/or biscyclopentadienyl magnesium.

Figure 1:
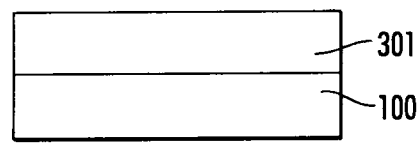
FIG. 1 is a schematic diagram of the epilayer structure of a portion of a light-emitting diode having a single III-Nitride buffer layer, according to a preferred embodiment of the present invention.
Figure 2A:
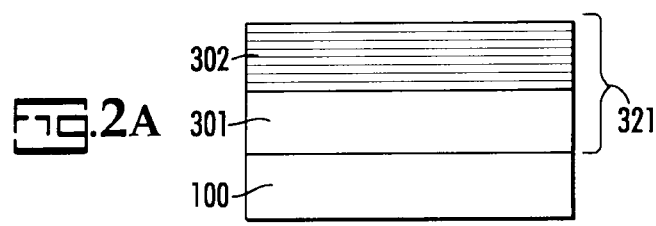
FIG. 2a is a schematic diagram of the epilayer structure of a portion of a light-emitting diode having multiple III-Nitride buffer layers, according to a preferred embodiment of the present invention.
Figure 2B:
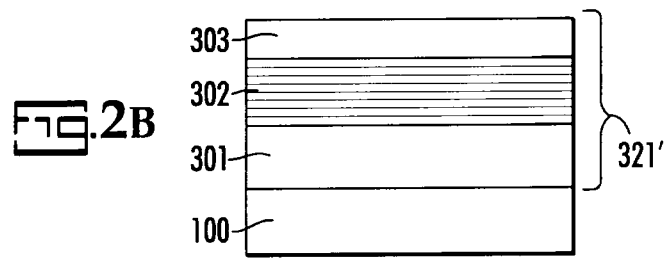
FIG. 2b is a schematic diagram of the epilayer structure of a portion of a light-emitting diode having multiple III-Nitride buffer layers, according to another preferred embodiment of the present invention.
Figure 2C:
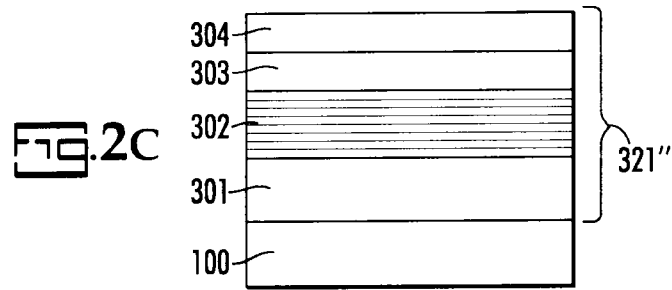
FIG. 2c is a schematic diagram of the epilayer structure of a portion of a light-emitting diode having multiple III-Nitride buffer layers, according to another preferred embodiment of the present invention.

FIGS. 1-3 show various embodiments of template 10 of the present LED as it is constructed. As shown in FIG. 1, a first buffer layer 301 is grown on a non c-plane of a substrate 100. First buffer layer 301 is made of a Group III-Nitride material, preferably $Al_xIn_yGa_{1-x-y}N$, wherein $0 \le x \le 1$, $0 \le y \le 0.2$ and $0 < x+y \le 1$. Alternatively, as shown in FIG. 2A-2C, a first buffer layer 321 may actually be made of multiple sub-layers. FIGS. 2A, 2B, and 2C show three different implementations of first buffer layer 321, 321' and 321", respectively, using sub-layers 301, 302, 303, 304 of a Group III-Nitride material, preferably $Al_xIn_yGa_{1-x-y}N$, wherein $0 \le x \le 1$, $0 \le y \le 0.2$ and $0 \le x+y \le 1$. Sub-layer 301 is preferably made of $Al_xIn_yGa_{1-x-y}N$, wherein $0 \le x \le 1$, $0 \le y \le 0.2$ and $0 \le x+y \le 1$; Sub-layer 302 is preferably an AlInGaN/AlInGaN super-lattice. Sub-layer 303 is preferably undoped AlInGaN while sub-layer 304 is AlInGaN doped with silicon. Buffer layer 321 in FIG. 2A includes sub-layers 301 and 302. Buffer layer 321' in FIG. 2B includes sub-layers 301, 302, and 303. Buffer layer 321" in FIG. 2C includes sub-layers 301, 302, 303, and 304.

The first III-Nitride buffer layer 321 is grown to approximately 0.1-5 µm thick, depending on the composition and sequence of layers used, over a substrate 100 using a combination of the pulsed atomic layer epitaxy (PALE) technique and conventional metal-organic chemical vapor deposition (MOCVD). First buffer layer 321 is preferably formed of at least one sub-layer of $Al_xIn_yGa_{1-x-y}N$, wherein $0 \le x \le 1$, $0 \le y \le 0.2$ and $0 \le x+y \le 1$.

In one embodiment a portion of the final LED epilayer is trenched. The trenching is done in first buffer layer 321, and may also extend into substrate 100. The trenching process is performed using standard photolithographic techniques in combination with either wet or dry etching processes that are well established in the prior art. However, the trenches can be much deeper than in the prior art. In particular, the trenches are at least 0.3 µm deep if the first buffer layer is made of AlN and are from at least 0.1 µm to 20 µm deep if the first buffer layers, 321, 321' or 321", are used. In the case of GaN, the trench depth ranges from 1 µm to 20 µm and may also extend into the substrate. In another example, the substrates are also patterned with at least 0.1 µm deep trenches.

After trenching, the pulsed lateral overgrowth (PLOG) layer 401 is grown on the buffer layer to cause the wafer surface to coalesce over the formed trenches (see FIGS. 3A, 3B, 3C and 4). The Group III-Nitride PLOG layer 401 is grown by pulsing at least one precursor source to enhance the lateral growth rate over vertical growth rate until PLOG layer 401 is completely coalesced and has regions with dislocation densities less than that of buffer layer 321.

Subsequently, additional AlInGaN layers, wherein $0 \le x \le 1$, $0 \le y \le 0.2$ and $0 \le x+y \le 1$, are optionally deposited after coalescence that together with 401, form a second buffer 421. These layers are shown as 402, 403, and 404 in FIGS. 3A, 3B, and 3C. These layers help to minimize overall strain of the epitaxial layer and also assist with epitaxial planarization that has beneficial effects for the light emitting device active region.

Figure 3A:
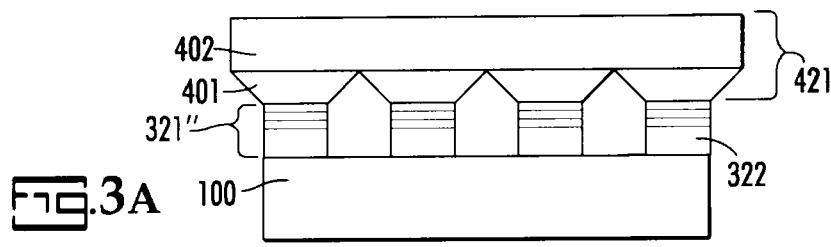
FIG. 3a is a schematic diagram of a portion of the epilayer structure of the light-emitting diode of FIG. 4, shown with a portion of the first buffer now trenched according to a preferred embodiment, and with a laterally overgrown PLOG buffer according to a preferred embodiment.
Figure 3B:
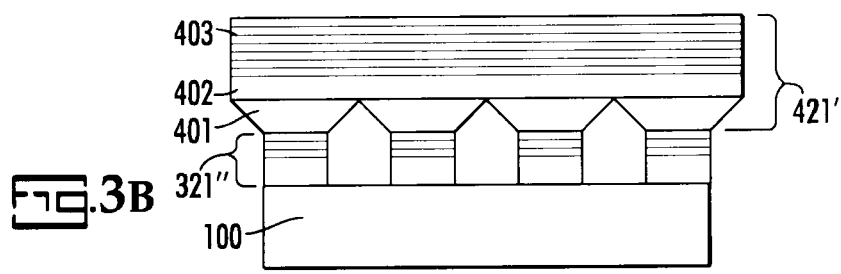
FIG. 3b is a schematic diagram of a portion of the epilayer structure of the light-emitting diode of FIG. 4, shown with a portion of the first buffer now trenched according to a preferred embodiment, and with a laterally overgrown PLOG buffer according to a preferred embodiment.
Figure 3C:
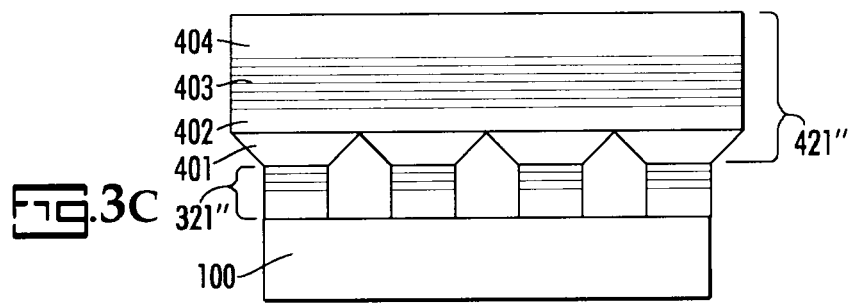
FIG. 3c is a schematic diagram of a portion of the epilayer structure of the light-emitting diode of FIG. 4, shown with a portion of the first buffer now trenched according to a preferred embodiment, and with a laterally overgrown PLOG buffer according to a preferred embodiment.

Trenching is the selective removal of material leaving narrow strips of material or pillars remaining as seen in FIGS. 3A-3C. These narrow strips may be straight or curved but are preferably parallel and most preferably patterned, such as for example in stripes, circles, hexagons, squares or rectangles. After patterning a layer 401 is applied to the first buffer by pulsed lateral overgrowth techniques so that it will grow laterally, bridging the gaps between the stripes as illustrated in FIG. 3A-3C. Layer 401 is preferably made of $Al_xIn_yGa_{1-x-y}N$, wherein $0 \le x \le 1$, $0 \le y \le 0.2$ and $0 \le x+y \le 1$. After the layer 401 is completed, as shown for each of the three embodiments illustrated in FIG. 3A-3C, additional layers may be deposited to complete alternate preferred embodiments of second buffer layers 421, 421' and 421".

FIG. 3A shows one implementation of a second buffer, 421, on top of the epilayer construction shown in FIG. 2C, after trenching first buffer layer 321" to form pillars 322. Any first buffer layer: 321, 321' or 321", could be used, but only the epilayer of FIG. 2C, namely with first buffer layer 321", is shown in FIGS. 3A-3C in order to simplify the drawings. FIGS. 3B and 3C show additional implementations of the second buffer 421, namely, 421' and 421", in FIGS. 3B and 3C, respectively, with sub-layers 401, 402, 403, and 404 shown in particular combinations in each of FIGS. 3A-3C. FIG. 3A shows second buffer layer 421 includes sub-layer 401 and sub-402; FIG. 3B shows second buffer layer 421' includes sub-layer 401, 402, and 403; and FIG. 3C shows second buffer layer 421" includes sub-layer 401, 402, 403, and 404.

FIG. 4 illustrates template 10 of FIG. 3C, now with a layered, UV-emitting structure 12 thereon (which UV-emitting structure including layers 500, 600, 700, 800 and 900), as will be described below, plus metal contacts 980 and 990. Except for metal contacts, 990 and 980, and the substrate 100, all layers are made of III-Nitride material. In addition, the substrate has a crystallographic orientation along a plane which differs from the C-plane such as the A-plane, M-plane or R-plane and has a mis-orientation ranging from 0.0° to 10° from its axis. The M-plane or A-Plane is preferred with the M-plane being most preferred.

Then, as illustrated in FIG. 4, the LED structure is added to the epilayer beginning with another III-Nitride layer 500 but with a first type of conductivity, applied directly on second buffer 421, preferably an n+ layer made of $Al_xIn_yGa_{1-x-y}N$, wherein $0 \le x \le 1$, $0 \le y \le 0.2$ and $0 \le x+y \le 1$, is formed such that the layer is transparent to light to be emitted from the quantum well active region. Another III-Nitride superlattice layer 600 is then formed which includes one or more barrier and one or more well sub-layers, each having different compositions such that the band-gap of the barrier layer is larger than that of the well layer. The thickness of the barrier should be between 20 and 400 Å and the well layers should be between 10 and 200 Å. This well sub-layer has a specific band-gap and is designed to provide a region with good quantum confinement, wherein electrons and holes readily combine, preferably with radiative and non-radiative recombination but with radiative recombination dominating the non-radiative recombination. The quantum well sub-layer emits light in the range of 200 nm to 400 nm and more preferably 190 nm to 369 nm. Both layers 500 and 600 are given their first type of conductivity using silicon, or are co-doped using a combination of silicon and indium and/or unintentionally doped with carbon. Layer 500 has a band gap lower than the PLOG layer 401 but higher than the quantum well and barrier sub-layers of 600. In some implementations, the well sublayers are undoped.

A p-type AlInGaN electron blocking layer 700 is incorporated directly above the active region layer 600, such that the band-gap of 700 is larger than the bandgap of the barrier sublayer in 600. Magnesium is used as the p-type dopant. Two additional p-type AlInGaN layers 800, and 900, are formed on top of 700 such that the band-gap of the layers decreases for each subsequent layer. Layer 800 may be one single AlInGaN layer, or may consist of a compositionally graded layer, a series of decreasing composition superlattices, or several distinct layers with decreasing bandgap.

A mesa-type LED may then be fabricated, the type shown in FIG. 4, using reactive ion etching (RIE) to access the bottom n+ layer. Note that this type device's geometry results in only a portion of the active area containing low-defect density laterally grown "wing" regions. Finally, probe metal conducting pads 980, 990 are deposited on both the n+ and p+ layers, respectively. Ti/Al/Ti/Au and Ni/Au are used as metal contacts for the n- and p-contacts, respectively, however, the n-metal contacts can be made of Ti, Al, Ni, Au, Mo, Ta or any combination of these metals. The second contact, the p+ layer contact, can be made of Pd, Ni, Ag, Au, ITO, NiO, PdO or any combination of the above-mentioned metals. These contacts could be annealed in air, a forming gas, nitrogen or any combination of such.

In an alternative configuration, after construction the substrate may be removed by polishing, etching or lifting-off using a laser and then a metallic contact layer can be applied to the backside of the n-layer 500. In this configuration, contact 980 is located on the backside of 500 instead of the topside and can be located vertically below the p-contact 990.

Figure 5:
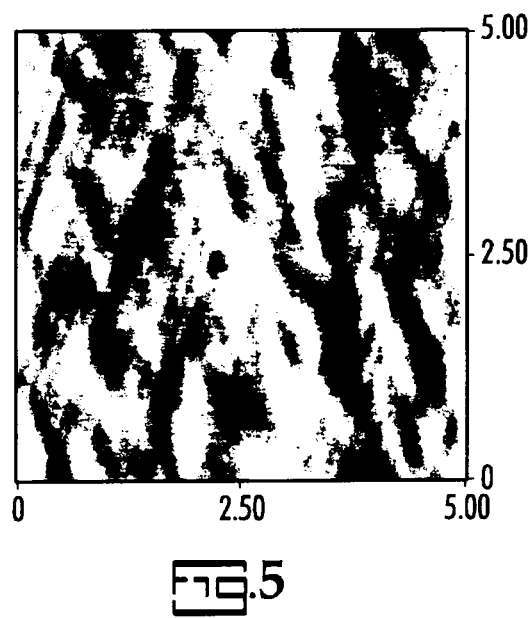
FIG. 5 is an atomic force microscopic surface image of a 348 nm device structure grown on an m-GaN substrate.
Figure 6:
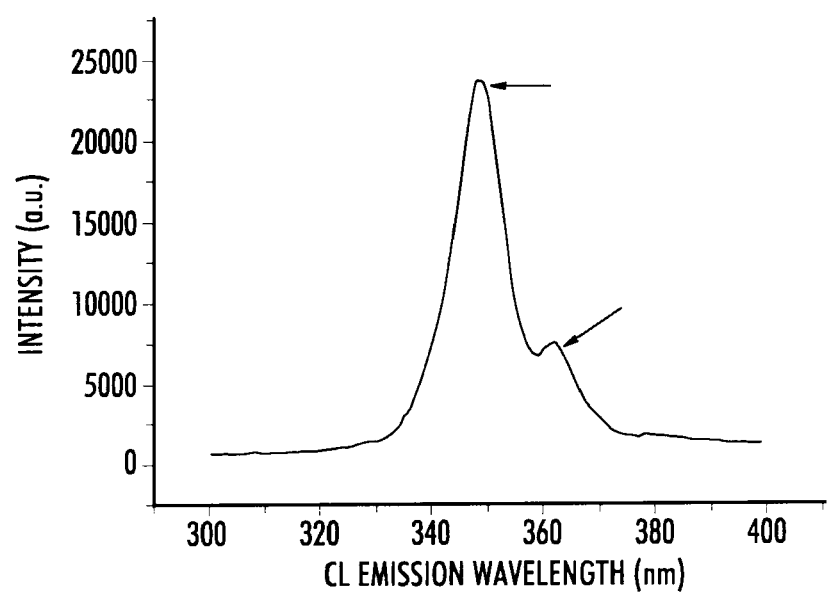
FIG. 6 is a cathode luminescence (CL) emission spectrum of an LED structure formed on non-polar m-GaN substrate.
Figure 7:
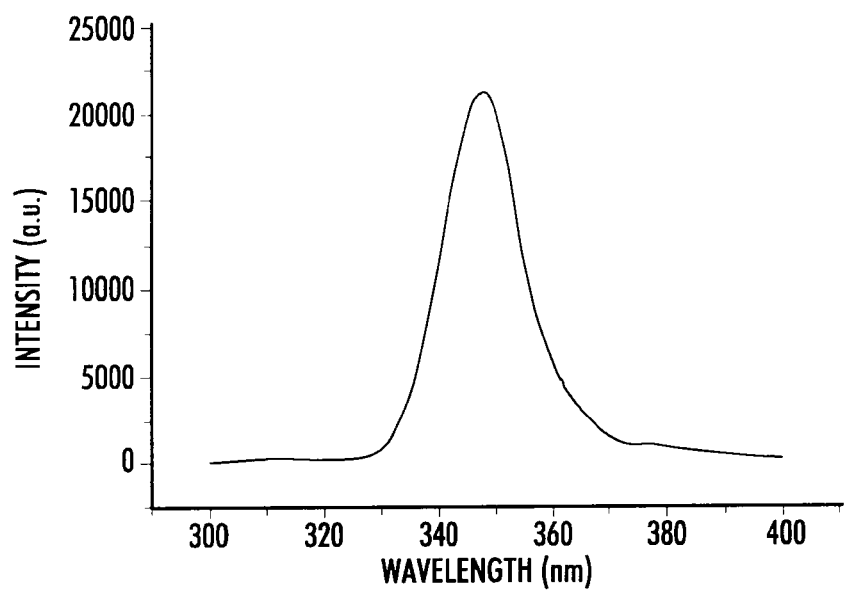
FIG. 7 is a typical photo-luminescence spectrum of an LED structure formed on a non-polar GaN substrate.

By X-ray diffraction (XRD), the presence of MQW superlattice and the other layers were confirmed. The morphology of the entire structure was extremely smooth as evidenced by atomic force microscopic (AFM) and optical microscopic analyses. FIG. 5 presents the AFM surface image of the device structure and the root mean square (RMS) roughness index measured was 0.32 nm. Cathode luminescence (CL) measurements showed emission from the $Al_yGa_{1-y}N$ ($y \approx 0.07$) MQW superlattice at a wavelength of about 349 nm, as shown in FIG. 6. This was reaffirmed by the photoluminescence (PL) analysis result, wherein, a prominent emission peak at 348.3 nm was observed, as shown in FIG. 7. In addition, no wavelength shift was observed with the increase of excitation source power. The inventors are unaware of any prior art light emission devices with lower wavelength emission in a non-polar nitrides based MQW structure on bulk m-GaN substrates.

Using the present method, a 3 μm template of AlN was grown on m-plane SiC and subsequently etched using reactive ion etching. The etch mask consisted of stripes with a 12 μm period that resulted in 2 μm mesas with 10 μm trenches. MOHVPE re-growth was then performed to coalesce the wafer. The final thickness of the m-plane AlN was approximately 10 μm with no cracking.

Figure 8:
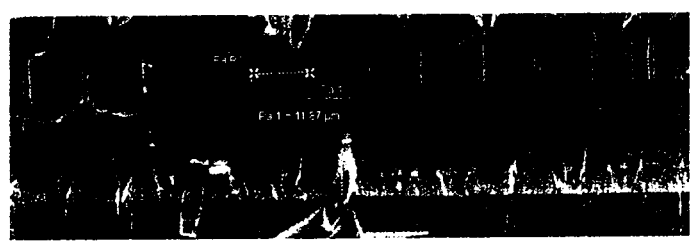
FIG. 8 is a cross-sectional scanning electromicrograph of m-plane AlN grown on a grooved template.
Figure 9:
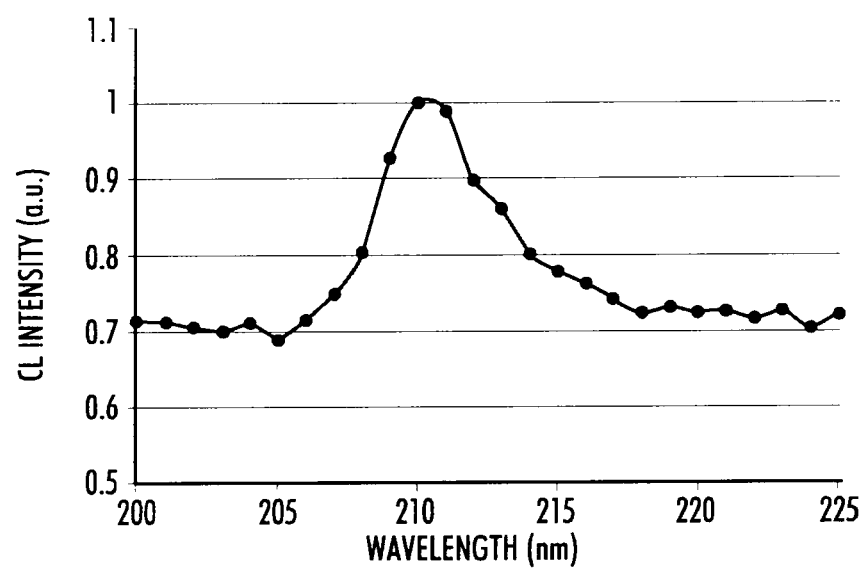
FIG. 9 is a CL spectrum of m-plane AlN obtained at 25 kV showing emission at 210 nm.

Material characterization including atomic force microscopy (AFM), x-ray diffraction, CL, and scanning electron microscopy (SEM) were performed to analyze the structural quality of the resulting layer. FIGS. 8 and 9 show a cross-sectional scanning electron micrograph and CL image, respectively. The SEM image shows that the films coalesced with voids later opening at the coalescence front which subsequently re-coalesced. The CL image shows emission at approximately 210 nm which is characteristic of what has previously been observed on MOCVD grown c-plane AlN.

It will be apparent to those skilled in the art of ultraviolet light-emitting diodes and laser diodes that many modifications and substitutions can be made to the preferred embodiments described herein without departing from the spirit and scope of the present invention, defined by the appended claims.

What is claimed is:
1. A light-emitting device comprising:
    an ultraviolet light-emitting structure having
        i. a first layer with a first conductivity, and
        ii. a second layer with a second conductivity;
        iii. an light emitting quantum well region above said first layer and between said first layer and said second layer
    b. a first electrical contact in electrical connection with said first layer;
    c. a second electrical contact in electrical connection with said second layer; and d. a template serving as a platform for said ultraviolet light-emitting structure, said template comprising a non c-plane first buffer layer wherein said first buffer layer is trenched;

whereby, when an electrical potential is applied to said first and second electrical contacts, said device emits ultraviolet light, said device has reduced internal polarization fields.

2. The light-emitting device of claim 1 wherein said trenched first buffer layer has trenches that are at least 0.2 μm deep and spacing between the trenches varies from 2-15 micron.

3. The light-emitting device of claim 1 further comprising a second buffer layer.

4. The light-emitting device of claim 3 wherein said second buffer layer is coalesced over said trenched first buffer layer.

5. The light-emitting device of claim 3 wherein at least one of said first buffer layer and said second buffer layer comprises $Al_xIn_yGa_{1-x-y}N$, wherein $0 \leq x \leq 1$, $0 \leq y \leq 0.2$, $0 < x+y \leq 1$.

6. The light-emitting device of claim 1 wherein said non c-plane first buffer layer is selected from an m-plane {1-100} buffer layer, an a-plane {11-20} buffer layer, a {1014} semi polar buffer layer, a {1122} semi polar buffer layer, a {1011} semi polar buffer layer, a {1013} semi polar buffer layer, a {1012} semi polar buffer layer, and a {2021} semi polar buffer layer.

7. The light-emitting device of claim 6 wherein said non c-plane first buffer layer is selected from an m-plane buffer layer and an a-plane buffer layer.

8. The light-emitting device of claim 7 wherein said non c-plane buffer layer is a m-plane buffer layer.

9. The light emitting device of claim 1 wherein said non c-plane first buffer layer is a layer formed on a non c-plane of a substrate selected from the group consisting of aluminum nitride, gallium nitride, aluminum gallium nitride, aluminum indium gallium nitride, aluminum indium nitride, silicon carbide, sapphire and lithium aluminate.

10. The light emitting device of claim 1 wherein said ultraviolet light-emitting structure emits light with a wavelength of 200-400 nm.

11. The light-emitting device of claim 1 wherein said first buffer layer is made of $Al_xIn_yGa_{1-x-y}N$, wherein $0 \leq x \leq 1$, $0 \leq y \leq 0.2$ and $0 < x+y \leq 1$.

12. The light-emitting device of claim 1, wherein said first buffer layer comprises at least one superlattice sub-layer having plural layers of $Al_xIn_yGa_{1-x-y}N$, wherein $0 \leq x \leq 1$, $0 \leq y \leq 0.2$ and $0 < x+y \leq 1$.

13. The light-emitting device of claim 1, wherein said first buffer layer comprises a first sub-layer made of $Al_xIn_yGa_{1-x-y}N$, wherein $0 < x \leq 1$, $0 \leq y \leq 0.2$ and $0 < x+y \leq 1$, and wherein said first sub-layer is not doped.

14. The light-emitting device of claim 13, wherein said first buffer layer comprises a second sub-layer made of $Al_xIn_yGa_{1-x-y}N$, wherein $0 \leq x \leq 1$, $0 \leq y \leq 0.2$ and $0 \leq x+y \leq 1$) that is doped with silicon or indium or co-doped with indium and silicon or indium or co-doped with indium and silicon.

15. The light-emitting device of claim 1, wherein said first buffer layer comprises:
a first sub-layer comprising $Al_xIn_yGa_{1-x-y}N$, wherein $0 \leq x \leq 1$, $0 \leq y \leq 0.2$ and $0 \leq x+y \leq 1$, and wherein said first sub-layer is not doped;
at least one superlattice sub-layer comprising plural layers of $Al_xIn_yGa_{1-x-y}N$, wherein $0 \leq x \leq 1$, $0 \leq y \leq 0.2$ and $0 \leq x+y \leq 1$; and a second sub-layer made of $Al_xIn_yGa_{1-x-y}N$, wherein $0 \leq x \leq 1$, $0 \leq y \leq 0.2$ and $0 \leq x+y \leq 1$, and wherein said second sub-layer is doped with silicon or indium or co-doped with indium and silicon.

16. The light-emitting device of claim 15, wherein said first buffer layer further comprises a third sub-layer comprises $Al_xIn_yGa_{1-x-y}N$, wherein $0 \leq x \leq 1$, $0 \leq y \leq 0.2$ and $0 \leq x+y \leq 1$, and wherein said third sub-layer is not doped.

17. The light emitting device of claim 1 wherein the first buffer layer comprises $Al_xIn_yGa_{1-x-y}N$ wherein $0 \leq x \leq 1$, $0 \leq y \leq 0.2$, $0 \leq x+y \leq 1$.

18. The light emitting device of claim 17 wherein the first buffer layer comprises $Al_xIn_yGa_{1-x-y}N$ wherein $0 \leq x \leq 1$, $0 \leq y \leq 0.2$, $0 \leq x+y \leq 1$.

19. The light emitting device of claim 18 wherein the first buffer comprises $Al_xIn_yGa_{1-x-y}N$ wherein $0.25 \leq x \leq 1$, $0 \leq y \leq 0.2$, $0.25 \leq x+y \leq 1$.

20. The light emitting device of claim 19 wherein the first buffer layer comprises $Al_xIn_yGa_{1-x-y}N$ wherein $0.5 \leq x \leq 1$, $0 \leq y \leq 0.2$, $0.5 \leq x+y \leq 1$.

21. The light emitting device of claim 20 wherein the first buffer layer comprises $Al_xIn_yGa_{1-x-y}N$ wherein $0.9 \leq x \leq 1$, $0 \leq y \leq 0.10$, $0.9 \leq x+y \leq 1$.

22. The light emitting device of claim 21 wherein the first buffer layer comprises $Al_xIn_yGa_{1-x-y}N$ wherein $0.99 \leq x \leq 1$, $0 \leq y \leq 0.01$, $0.99 \leq x+y \leq 1$.

23. The light-emitting device as recited in claim 21, further comprising a fourth sub-layer.

24. The light emitting device of claim 1 wherein at least one of said first buffer layer and a second buffer layer are deposited in such a way that the group III and group V materials are injected via a pulsed growth method wherein the group III and group V materials do not have continuous flow, but are pulsed either sequentially, or such that the group III source pulses are partially on with no group V source pulse or partially overlap with a group V source pulse.

25. The light-emitting device of claim 1, further comprising a second buffer layer further comprising:
a first sub-layer layer coalesced over a trenched first buffer layer to form a first planar layer; and
a second sub-layer applied to said first sub-layer.

26. The light-emitting device as recited in claim 25 wherein said second sub-layer is a superlattice layer.

27. The light-emitting device as recited in claim 26, further comprising a third sub-layer wherein said third sub-layer is a superlattice layer.

28. The light-emitting device as recited in claim 1, wherein said first electrical contact is carried by said first buffer layer with a first conductivity.

29. The light-emitting device as recited in claim 1, wherein said first electrical contact is carried by said first layer with said first conductivity, and wherein said template further comprises a substrate, said first buffer layer being between said substrate and said second buffer layer.

30. The light-emitting device as recited in claim 1, wherein said first buffer layer is made of AlN and is trenched to a depth of at least 0.1 μm.

31. The light emitting device as recited in claim 1, wherein said light emitting structure includes a quantum well region comprising alternating layers of:
a quantum well comprising $Al_xIn_yGa_{1-x-y}N$ wherein $0 \leq x \leq 1$, $0 \leq y \leq 0.2$, and $0 \leq x+y \leq 1$, said quantum well having a surface and a band gap; and
a barrier layer on said surface of said quantum well, said barrier layer having a band gap larger than said band gap of said quantum well, and wherein said barrier layer includes $Al_xIn_yGa_{1-x-y}N$ wherein $0 < x \leq 1$, $0 \leq y \leq 0.2$ and $0 < x+y \leq 1$, and wherein said quantum well region begins and terminates with said barrier layer.

32. The light emitting device as recited in claim 31 wherein said quantum well region comprises a single quantum well and multiple quantum layers.

33. The light emitting device as recited in claim 31, wherein said quantum well and said barrier layer have different compositions.

34. The light emitting device as recited in claim 31, wherein said quantum well is doped with at least one n-type dopant selected from the group consisting of silicon, indium and oxygen.

35. The light emitting device as recited in claim 31, wherein said quantum well is doped with at least one p-type dopant selected from the group consisting of magnesium, zinc, beryllium and carbon.

36. The light emitting device as recited in claim 31, wherein said quantum well is doped with at least one n-type and at least one p-type dopant.

37. A light-emitting device comprising:
   a. an ultraviolet light-emitting structure having
      i. a first layer with a first conductivity,
      ii. a second layer with a second conductivity and
      iii. a light emitting quantum well region between said first layer and second layer;
   b. a first electrical contact in electrical connection with said first layer;
   c. a second electrical contact in electrical connection with said second layer; and
   d. an m-plane template serving as a platform for said ultraviolet light-emitting structure, said template comprising a first buffer layer.

38. The light-emitting device of claim 37 wherein said first buffer layer comprises $Al_xIn_yGa_{1-x-y}N$, wherein $0 \leq x \leq 1$, $0 \leq y \leq 0.2$ and $0 \leq x+y \leq 1$.

39. The light-emitting device of claim 38 further comprising a second buffer layer coalesced over said trenched first buffer layer.

40. The light-emitting device of claim 39, wherein said second buffer layer further comprises:
   a first sub-layer coalesced over said first buffer layer to form a first planar layer; and
   a second sub-layer applied to said first sub-layer, said first and said second sub-layers comprises $Al_xIn_yGa_{1-x-y}N$, wherein $0 \leq x \leq 1$, $0 \leq y \leq 0.2$ and $0 \leq x+y \leq 1$ wherein the composition of said first sub-layer is different from said second sub-layer.

41. The light-emitting device as recited in claim 40 wherein said second sub-layer is a superlattice layer.

42. The light-emitting device as recited in claim 40, further comprising a third sub-layer, wherein said third sub-layer is a superlattice layer comprises $Al_xIn_yGa_{1-x-y}N$, wherein $0 \leq x \leq 1$, $0 \leq y \leq 0.2$ and $0 \leq x+y \leq 1$.

43. The light-emitting device as recited in claim 42, further comprising a fourth sub-layer.

44. The light-emitting device of claim 37 wherein said first buffer layer is trenched.

45. The light-emitting device of claim 44 wherein said trench has a depth of at least 0.4 μm.

46. The light-emitting device as recited in claim 44, wherein said the first buffer layer is trenched in a pattern.

47. The light emitting device as recited in claim 44, wherein said first buffer layer is trenched to a depth of at least 0.1 μm.

48. The light-emitting device as recited in claim 37, wherein said first electrical contact is carried on the said first buffer layer with a first conductivity.

49. The light-emitting device as recited in claim 37, wherein said first electrical contact is carried by said first layer with said first conductivity, and wherein said template further comprises a substrate, said first buffer layer being between said substrate and said second buffer layer.

50. The light-emitting device as recited in claim 49 wherein said substrate has a mis-orientation of less than 10° from its axis.

51. The light-emitting device as recited in claim 50 wherein said first buffer layer is grown on said substrate, said substrate having a root mean square roughness ranging from 1 Å to 100 micron.

52. The light-emitting device as recited in claim 37, wherein said first electrical contact is made of Ti, Al, Ni, Au, Mo, Ta or a combination of any of these metals as a single layer or multistack layer.

53. The light-emitting device as recited in claim 37, wherein said second electrical contact is made of Pd, Ni, Ag, Au, ITO, NiO, or PdO or a combination of any of these metals as a single layer or multistack layer.

* * * * *